United States Patent [19]

Kasperski

[11] 4,424,560
[45] Jan. 3, 1984

[54] COMPONENT OF AN ELECTRIC OR ELECTRONIC CIRCUIT, IN PARTICULAR A DIODE AS WELL AS A BRIDGE RECTIFIER AND ALTERNATOR OF MOTOR VEHICLES COMPRISING IT

[75] Inventor: Jerzy R. Kasperski, Paris, France

[73] Assignee: S.E.V. Alternateurs, Issy-les-Moulineaux, France

[21] Appl. No.: 324,554

[22] Filed: Nov. 24, 1981

[30] Foreign Application Priority Data

Dec. 1, 1980 [FR] France .............................. 80 25465

[51] Int. Cl.³ .............................................. H02M 1/00
[52] U.S. Cl. .................................................. 363/144
[58] Field of Search .............. 29/33 M, 748, 838, 842, 29/854; 363/144, 145

[56] References Cited

U.S. PATENT DOCUMENTS

| | | | |
|---|---|---|---|
| 3,456,339 | 7/1969 | Small | 29/628 |
| 3,866,072 | 2/1975 | Nagai | 363/145 X |
| 3,979,659 | 9/1976 | Lynch, Jr. et al. | 363/145 |
| 4,321,664 | 3/1982 | Matthai | 363/145 X |

FOREIGN PATENT DOCUMENTS 2824607 12/1978 Fed. Rep. of Germany .
822711 10/1959 United Kingdom .

*Primary Examiner*—William M. Shoop
*Attorney, Agent, or Firm*—Brisebois & Kruger

[57] ABSTRACT

A diode has an electrode in the form of a coiled wire serving as both electrical connection and vibration damper, particularly useful in the case of a diode to be used in the diode bridge rectifier of a motor vehicle alternator. The vibration damper formed by a coiled part of the wire, comprises a helical intermediate coil between a planar end coil to be soldered to the diode proper and a bend joining the vibration damper to a rectilinear portion of the electrode.

14 Claims, 4 Drawing Figures

COMPONENT OF AN ELECTRIC OR ELECTRONIC CIRCUIT, IN PARTICULAR A DIODE AS WELL AS A BRIDGE RECTIFIER AND ALTERNATOR OF MOTOR VEHICLES COMPRISING IT

DESCRIPTION

The present invention relates to the manufacture of a component of an electric or electronic circuit, and more particularly to the making of a connector terminal for the electrical connection of this component to the circuit using it. The invention finds particular application in the production of diodes which may be used for making bridge rectifiers for alternators of motor vehicles.

It is known that an alternator of a motor vehicle is connected to a bridge rectifier comprising diodes making it possible to supply a direct current output from the alternating current supplied by the alternator. The bridge rectifier comprises a plurality of diodes which are generally carried by a cooler enabling them to be cooled in a satisfactory manner. The cooler provides one of the electrical connections of the diodes, the other connection being made by means of an output terminal which is connected to a circuit generally carried by a plate. In the course of operation, the alternator is constantly subjected to vibration so that in order to ensure the long life of the diode connections it has been found advisable to interpose a vibration damper device between the semi-conductor crystal of the diode and the connection of the terminal with the circuit to which it is joined. For simplification of this vibration damper device, it has already been proposed that the terminal be arranged on an undulation having an approximately semi-circular shape disposed in a plane passing through the terminal axis; it has also been proposed to arrange on the terminal, between its zone of soldering with the diode proper, and its end zone where it is connected with an external circuit, a helical winding which performs the function of a spring and damps the vibrations. The problem outlined above is not specific to the connection of diodes, but arises in the case of external connections of all components of electric or electronic circuits.

This type of manufacture is perfectly satisfactory but requires two successive manufacturing stages: on the one hand, it is necessary to form the vibration damper device on the terminal and, on the other hand, it is necessary to form the soldering zone which must have a planar part allowing a good soldering of the terminal on the component. The soldering zone is generally constituted by a flattened portion made at the end of the terminal, where the connection with the component is to be effected. This flattened portion is substantially perpendicular to the axis of the terminal and is generally in the form of either an enlargement whose axis is substantially the axis of the terminal, or a zone where the terminal wire has been flattened and bent at right angles in relation to the terminal proper. In all these cases two successive manufacturing operations are necessary to form, on the one hand, the vibration damper device and, on the other hand, the soldering zone. In the case of diodes, the soldering may be effected either directly on the semi-conductor crystal of the component or on a block which is in electrical contact with the semi-conductor crystal as is the case with a button diode.

The object of the present invention is to provide for the manufacture of terminals for components making it possible to obtain in a single manufacturing operation, on the one hand the soldering zone of the terminal, and on the other hand the vibration damping means necessary for ensuring the long life of the material in spite of the vibrations.

According to the present invention, there is provided an electric or electronic circuit component, including at least one helically coiled filiform stem soldered on to form a terminal of the component such that the coils formed in the said stem of the terminal constitute a vibration damper device of the terminal, the terminal coils including a substantially planar end coil constituting the soldering zone of the said terminal. It is thus possible to shape one end of the terminal appropriately in a single operation to form on the one hand the vibration damper device and on the other hand the soldering zone with the connection between the terminal and the component proper. The vibration damper device is constituted by a helical winding formed in the terminal wire, the substantially planar end coil of this winding servicing to allow the soldering. It is quite clear that the shaping of such terminals may be applied not only to the manufacture of diodes but also to any discrete electronic components comprising at least one semi-conductor crystal on which there is to be soldered, directly or indirectly (for example to a casing enclosing the crystal), the soldering zone of a terminal. Even more generally the invention may be applied to the terminal of any component of an electric or electronic circuit.

In a preferred embodiment, the part of the said terminal which does not constitute the vibration damper device is substantially rectilinear and the substantially planar end coil of the vibration damper device has its plane substantially perpendicular to the said rectilinear part of the terminal; the said end coil extends over an angle of from 190° to 340°; preferably the end coil of the vibration damper device subtends an angle of substantially 240° at its centre; the vibration damper device comprises, apart from its substantially planar coil constituting the soldering zone, at least one substantially helical coil to form a winding subtending an angle of at least 180° at its centre, the said winding being connected at one end to the above mentioned substantially planar end coil and at the other end to a bend in the radial direction which bend is extended by the rectilinear part of the terminal.

Provision may advantageously be made for the vibration damper device winding to comprise, apart from its substantially planar end coil constituting the soldering zone, a substantially helical coil over an angle of from 300° to 450°; in this way, the vibration damping function is perfectly obtained and it has been found unnecessary to make provision for a greater number of turns for the vibration damper device, it being understood that providing a substantially helical winding over a greater angle must be considered as coming within the scope of the present invention, as claimed herein, because the damping function can only be improved by this modification. Yet it should be observed that, in order to economise on the material forming the terminal, it is advisable not to increase unnecessarily the number of the turns of the winding assembly which constitutes the vibration damper device.

It is clear that if the coils of the winding constituting the vibration damper device are too close to each other the liquid solder by means of which the terminal is soldered on the component is in danger of rising by capillary action between the substantially planar end coil constituting the soldering zone and the next successive coils, in which case the damping action of the helical winding would be at least partly nullified. It follows therefrom that if too low a pitch is adopted for the winding, it becomes necessary to take special precautions when soldering the terminal to avoid any rising of the soldering material. It has been found that with the present invention the soldering may be effected without any precautions and without leading to any rising of the solder between the coils if the axial distance separating the coils of the vibration damper device exceeds 0.7 mm.

Moreover, the wire forming the terminal of the component of the present invention, has at one of its ends a helical winding and it is known that if products such as this terminal are carried in bulk it frequently happens that two or more such products intertwine, requiring manual intervention to separate them. This drawback is particularly irksome if an automatic feed is contemplated for the shaped terminals ready for soldering, and it has been found that this risk of intertwining may be prevented by limiting the axial pitch of the vibration damper device to a value below 1.8d, where d is the diameter of the cylindrical wire constituting the terminal.

Taking into account the usual dimensions of semiconductor components, and the mechanical characteristics of the materials such as copper generally used for making these terminals, it has been found that provision may advantageously be made for the outer diameter of the coils of the vibration damper device to be from 3d to 5d and for the electrode wire to have a diameter d of from 0.8 to 2 mm.

The invention may, in particular, be used for forming diodes, for instance button diodes whose semi-conductor crystal is held between two metal blocks interconnected by means of an outer casing. In this latter case, the substantially planar end coil of the terminal is not soldered directly on to the semi-conductor crystal but it is soldered with the interposition of a block.

It should be noted that the fact of having an end coil subtending at its centre an angle of from 190° to 340°, and preferably of substantially 240°, makes it possible for the shaped terminal to stand in a stable manner in a vertical position on the surface where the soldering is to take place. This constitutes an additional advantage for the automation of production of the component.

The present invention also provides a diode bridge rectifier comprising a cooler supporting diodes comprising components of the above defined type, the output terminals of the diodes being connected to a plate forming at least a part of the bridge rectifier circuit.

Finally, the present invention also provides a motor vehicle alternator comprising such a diode bridge rectifier.

To render the object of the present invention more readily understood there will be described below an embodiment, illustrated in the accompanying drawing by way of a purely illustrative and non-restrictive example.

Figure 1:
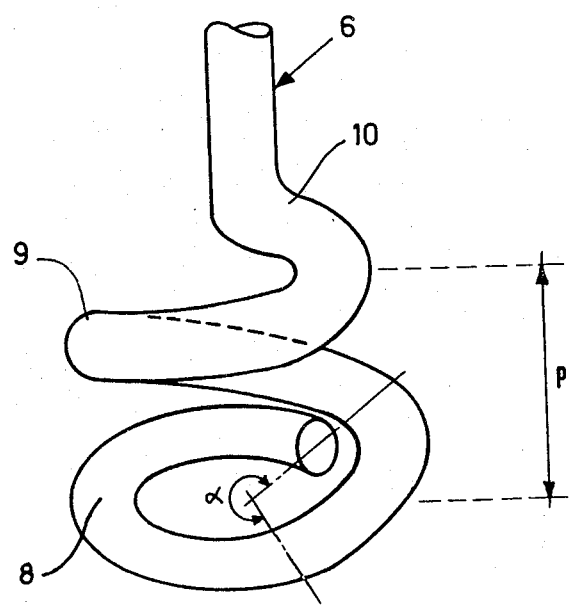
FIG. 1 shows, in perspective, the bottom part of a button diode electrode according to the present invention.
Figure 2:
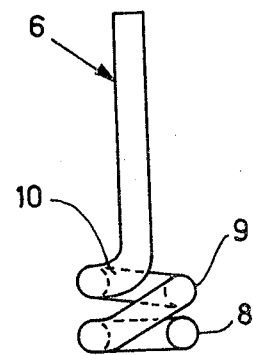
FIG. 2 shows, in elevation, the shaped electrode of FIG. 1.
Figure 3:
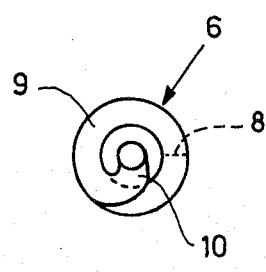
FIG. 3 shows a plan view of the electrode of FIG. 2.
Figure 4:
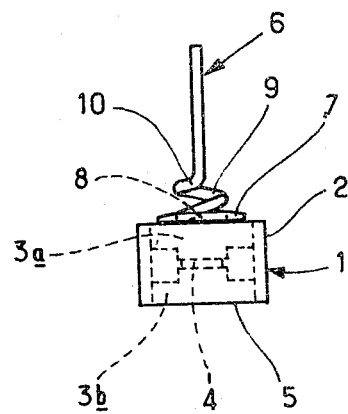
FIG. 4 shows a button diode comprising the electrode of FIGS. 1 to 3.

Referring to the drawings, a generally designated button diode 1 comprises a semi-conductor crystal 4 within a casing 2 between two blocks 3a, 3b. The base 5 of the block 3b has one polarity of the diode while the generally designated electrode 6 has the other.

The electrode 6 is formed by a cylindrical filiform copper wire having a diameter of 1.32 mm. This electrode comprises, at its base, a helical type winding whose free end is soldered on to the block 3a of diode 1 by means of a metal solder 7.

The helical type winding arranged at the bottom of electrode 6 is formed firstly by a substantially planar end coil, secondly a substantially helical intermediate coil 9, and thirdly a substantially radial bend 10 which connects the helical intermediate coil 9 with the rectilinear part of electrode 6.

The end coil 8 is arranged in a plane perpendicular to the rectilinear part of electrode 6 and it subtends an angle of 240° at its centre; generally the subtended angle may be from 190° to 340°. The outer diameter of the planar coil 8 is 5 mm.

The helical intermediate coil 9 which follows the end coil 8, subtends an angle of 360° at its centre and has an axial pitch p equal to 2.2 mm. There thus exists, between two axially opposite points of the outer surface of the assembly of the helical windings 8 and 9, a distance which always exceeds 0.8 mm.

The whole of the helical winding assembly 8,9,10 may be made in a single operation on a single machine.

The electrode 6, having been shaped in this way, is then placed on the block 3 in order to be soldered thereto by means of a metal solder 7. It will be found that, with the dimensions defined above, the solder 7 ensures the fixing of the planar coil 8 on the block 3a but does not rise under capillary action into the space axially separating the turns of the winding assembly 8,9 because the distance between these turns is adequate. In this way, the electrode 6, once its base coil 8 has been soldered, comprises at its lower part an integral vibration damper device formed by the assembly 9,10. Moreover it will be found that, for the soldering operation, the electrode 6 shaped as indicated above, may be placed on block 3 with the rectilinear upper part of the electrode 6 remaining perpendicular to the block 3a because the planar end coil 8 extends over a sufficient angle to ensure a stable equilibrium for the electrode standing on its base coil.

It should be noted that when electrodes 6 as described above have been manufactured, they may be carried in bulk without the risk of intertwining of a multiplicity of electrodes by imbrication of their helical turns since the space between two successive turns of the winding assemblies 8,9,10 is distinctly smaller than the diameter of the copper wire from which the electrode 6 is made. Thus such an electrode may be easily used in an automatic dispensing process, in order to automate diode production.

It will be found that the diode according to the invention has a very high vibration resistance and great reliability; moreover, its cost is reduced since the electrode can be shaped in a single operation.

The single embodiment described above should not be interpreted as in any way restrictive of the scope of the invention and may be subject to any desirable modifications which do not involve departing from the scope of the invention as defined by the claims.

I claim:

1. An electric or electronic circuit component including: a body portion having a flat surface; and a filiform terminal, said terminal including vibration damper means constituted by coils formed around an axis at one end of the filiform terminal, and said vibration damper means including a substantially planar end coil for soldering or said terminal to said body portion.

2. A component according to claim 1, wherein said terminal further includes a part which does not constitute the vibration damper means but is substantially rectilinear and substantially perpendicular to said substantially planar end coil of the vibration damper means.

3. A component according to claim 1, wherein said substantially planar end coil subtends at said axis an angle of from 190° to 340°.

4. A component according to claim 3, wherein said substantially planar end coil of the vibration damper means subtends an angle of substantially 240° at said axis.

5. A component according to claim 2, wherein said vibration damper means further comprises, in addition to said substantially planar end coil, at least a substantially helical coil to form a winding subtending at said axis an angle of at least 180°, and a bend in the radial direction, said winding being connected at one end to the said substantially planar end coil and at the other end to said part of the terminal which does not constitute the vibration damper means.

6. A component according to claim 5, wherein said substantially helical winding subtends at said axis an angle of from 300° to 450°.

7. A component according to claim 1, wherein each two successive turns of the vibration damper means are spaced by an axial distance of at least 0.7 mm.

8. A component according to claim 1, wherein said filiform terminal is formed of a cylindrical wire and the axial pitch of the coils of the vibration damper means is less than 1.8 times the diameter of said cylindrical wire.

9. A component according to claim 1, wherein said filiform terminal is formed of a cylindrical wire and the outer diameter of the coils of the vibration damper means is from 3 to 5 times the diameter of said cylindrical wire.

10. A component according to claim 1, wherein said filiform terminal is formed of a cylindrical wire having a diameter of from 0.8 to 2 mm.

11. A component according to any one of claims 1 to 10 wherein said component comprises a diode.

12. A diode according to claim 11, including a semiconductor crystal and a block abutting said semi-conductor crystal, and wherein said terminal is soldered on to said block.

13. A diode bridge rectifier comprising a plate forming at least one part of the bridge rectifier circuit; a plurality of diodes according to claim 11, said diodes having their said terminals connected to said plate; and a cooler supporting said diodes.

14. An alternator for a motor vehicle, said alternator comprising a diode bridge rectifier according to claim 13.

* * * * *